(12) United States Patent
Gueguen et al.

(10) Patent No.: US 6,845,481 B2
(45) Date of Patent: Jan. 18, 2005

(54) TURBODECODING METHOD WITH RE-ENCODING OF ERRONEOUS INFORMATION AND FEEDBACK

(75) Inventors: Arnaud Gueguen, Rennes (FR); Nadine Chapalain, Rennes (FR)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 578 days.

(21) Appl. No.: 09/827,093

(22) Filed: Apr. 6, 2001

(65) Prior Publication Data

US 2001/0039638 A1 Nov. 8, 2001

(30) Foreign Application Priority Data

May 3, 2000 (FR) .............................................. 00 05682

(51) Int. Cl.$^7$ ........................ H03M 13/00; H03M 13/03
(52) U.S. Cl. ........................................ 714/755; 714/786
(58) Field of Search .............................. 714/755, 752, 714/786

(56) References Cited

U.S. PATENT DOCUMENTS

| | | | | |
|---|---|---|---|---|
| 5,278,871 A | * | 1/1994 | Rasky et al. | 375/343 |
| 5,321,705 A | * | 6/1994 | Gould et al. | 714/795 |
| 5,721,745 A | * | 2/1998 | Hladik et al. | 714/755 |
| 5,936,972 A | * | 8/1999 | Meidan et al. | 714/712 |
| 6,029,264 A | | 2/2000 | Kobayashi et al. | 714/755 |
| 6,233,709 B1 | * | 5/2001 | Zhang et al. | 714/774 |
| 6,292,918 B1 | * | 9/2001 | Sindhushayana et al. | 714/755 |
| 6,298,084 B1 | * | 10/2001 | Vinggaard et al. | 375/224 |
| 6,499,128 B1 | * | 12/2002 | Gerlach et al. | 714/755 |

FOREIGN PATENT DOCUMENTS

WO    WO 99/09696    2/1999

OTHER PUBLICATIONS

A. Shibutani, et al., IEEE, vol. Conf. 50, XP–002142762, pps. 1570–1574, "Complexity Reduction of Turbo Decoding", Sep. 19–22, 1999.

A. Ambroze, et al., IEEE Proceedings–Communication, vol. 147, No. 2, XP–002163383, pps. 69–74, "Practical Aspects of Iterative Decoding", Apr. 2000.

* cited by examiner

*Primary Examiner*—Albert DeCady
*Assistant Examiner*—Esaw Abraham
(74) *Attorney, Agent, or Firm*—Oblon, Spivak, McClelland, Maier & Neustadt, P.C.

(57) ABSTRACT

A method of improving turboencoding by re-encoding erroneous information and subtracting their contribution at the input of the turboencoder. The subtraction of this contribution remedies the lack of convergence or convergence towards erroneous solutions observed in certain turbodecoding configurations. The method also applies to parallel concatenation turbodecoding, to serial concatenation turbodecoding, or to block turbodecoding. Different operations result according to the type of feedback envisaged.

26 Claims, 12 Drawing Sheets

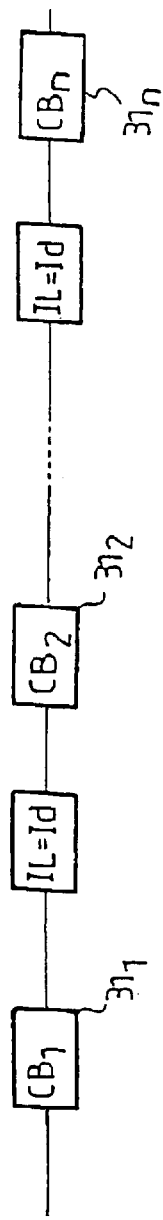
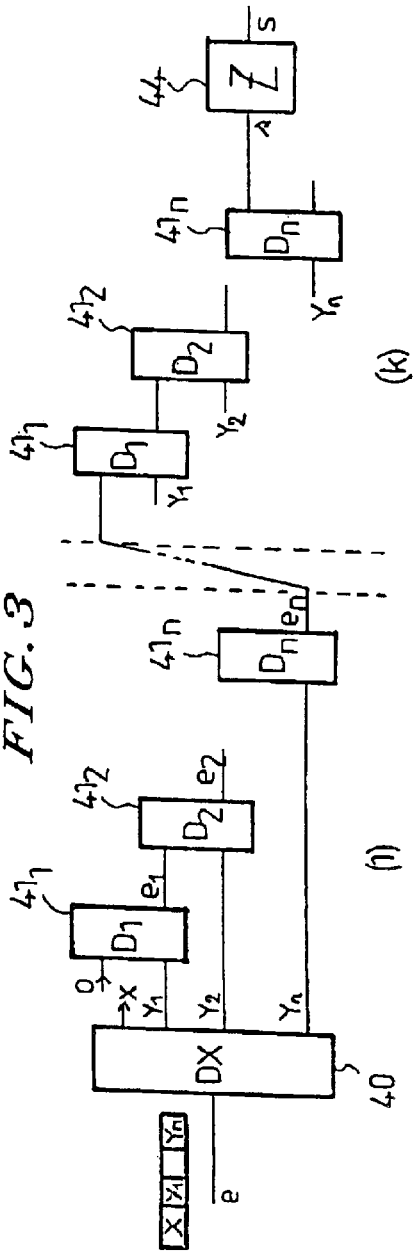
FIG. 2
FIG. 3

TURBODECODING METHOD WITH RE-ENCODING OF ERRONEOUS INFORMATION AND FEEDBACK

BACKGROUND OF THE INVENTION

1. Field of the Invention

The present invention concerns in general terms a method of decoding turbocoded information. More precisely it concerns an improvement to the decoding method when the latter exhibits a lack of convergence.

2. Discussion of the Background

Turbocodes currently constitute the most efficient error correcting codes since, amongst existing codes, they make it possible to obtain the lowest bit error rates for a given signal to noise ratio, and this with a reasonable decoding complexity. They can be used either for continuous digital transmissions or for transmissions by frames.

Turbocodes were introduced by C. Berrou, A. Glavieux and P. Thitimajshima in an article entitled "Near Shannon Limit Error-Correcting Coding and Decoding: Turbo-codes" which appeared in ICC-1993 Conference Proceedings, pages 1064–1070. Turbocodes have subsequently been the subject of many developments and today the term turbocodes is given to a class of codes based on two concepts:

The first concept is the concatenation of several simple codes, referred to as elementary codes, separated by interleaving steps, modifying the order in which the data are taken into account by these elementary codes. The elementary codes can be of different types: recursive systematic codes (denoted RSC) for convolutional turbocodes or block codes such as Hamming codes, RS codes or BCH codes for block turbocodes. Different types of concatenation can be envisaged. In parallel concatenation, the same information is coded separately for each coder after having been interleaved. In serial concatenation, the output of each coder is coded by the following coder after having been interleaved. The dimension of the turbocode means the number of elementary coders used for implementing the turbocode. The interleavings used can be of the uniform type, for example by entering the data to be interleaved row by row in a matrix and retrieving them column by column, this type of interleaving notably being employed in block turbocodes. In general, in order to improve performance, the turbocodes use non-uniform interleavings. This is the case notably with convolutional turbocodes.

The second concept is the iterative decoding of the turbocode, also referred to as turbodecoding. Each iteration of the decoding consists of the concatenation of several elementary decoding operations. The elementary decoders used for this purpose are of the weighted input and output type and each correspond to an elementary coder of the turbocoder. The weighted inputs and outputs of an elementary decoder translate the probabilities of the binary or m-ary data of the inputs respectively input to and output from the corresponding elementary coder. The weighted inputs and outputs can be labelled in terms of probabilities, likelihood ratios or log likelihood ratios (also denoted LLRs).

According to the scheme of the turbodecoder, the elementary decoders act one after the other (so-called serial turbodecoding) or simultaneously (so-called parallel turbodecoding). Naturally hybrid decoding schemes can also be envisaged. Interleaving and deinterleaving operations occur according to the deinterleaving and interleaving operations performed at the time of coding. They enable each elementary decoder to take into account information presented in the same order as at the input and output of the corresponding elementary coder, each elementary decoder thus using information corresponding to the information input to and output from the corresponding elementary coder. The input information of an elementary decoder is so-called a priori information consisting of noisy information from the corresponding elementary coder. From this a priori information and knowing the coding law of the corresponding elementary coder, the elementary decoder generates a posteriori information, which is an estimation, with greater reliability, of the information input to and/or output from the corresponding elementary coder. The additional information afforded by the a posteriori information compared with the a priori information is referred to as extrinsic information.

Various algorithms can be used in elementary decoding operations, notably the so-called MAP (Maximum A Posteriori), Log MAP and MaxLogMAP algorithms, also referred to as APP, LogAPP and MaxLogAPP, which all derive from the calculation of a posteriori probabilities knowing the a priori probabilities. These algorithms are for example described in the article entitled "Optimal and sub-optimal maximum a posteriori algorithms suitable for turbo-decoding" by P. Robertson, P. Hoeher and E. Villebrun, which appeared in European Trans. On Telecomm., Vol 8, pages 119–125, March–April 1997. For block turbocodes, the Chase algorithm can be used, as described in the article entitled "Near optimum product codes" which appeared in Proc. IEEE Globecom of 1994, pages 339–343.

According to the type of turbocoding used, the extrinsic information issuing from an elementary decoder combined with the systematic information or directly the a posteriori information issuing from an elementary decoder will be used, after any interleaving or deinterleaving, as a priori information by the following elementary decoder within the same iteration or by the preceding elementary decoder within the following iteration.

Whatever the case, at each iteration, the information input to and output from the elementary decoders is more and more reliable. The information produced by the end decoding operation or operations of an iteration is used for generating output information which is an estimation of the input information of the coder. In principle, after a sufficient number of iterations, the decoding method stagnates and the algorithm converges. A thresholding is carried out on the output information from the last iteration in order to generate the turbodecoded sequence. Although suboptimal in principal, turbodecoding gives performance close to that of the optimal decoder in general, whilst nevertheless having appreciably lesser complexity since it is of the order of that of the decoder of the elementary codes.

Before dealing in more detail with the structure of a few turbodecoders, it is necessary to briefly state the structure of the corresponding turbocoders.

FIG. 1 illustrates a turbocoder of the so-called PCCC (Parallel Concatenated Convolutional Code) type with n dimensions. The coding device comprises a set of elementary coders ($11_i$) concatenated in parallel and separated by interleavers ($10_i$). Each of the elementary coders is of the recursive systematic convolutional type (denoted RSC). Each elementary coder codes an interleaved version of the useful input information. The outputs of the different elementary coders are multiplexed by a multiplexer (12). Only the systematic part (X) is transmitted only once for all the coders in non-interleaved form.

FIG. 2 illustrates a turbocoder of the so-called SCCC (Serially Concatenated Convolutional Code) type with n dimensions. The coding device comprises a set of elementary coders ($21_i$) of the RSC type concatenated in series, two consecutive coders being separated by an interleaver ($20_i$). Each coder introducing its own redundancy, the interleavers of increasing rank are of increasing size.

FIG. 3 illustrates a turbocoder of the so-called BTC (Block Turbo-Code) type. The coding device there too consists of a set of elementary coders ($31_i$) concatenated in series, each elementary coder here being a block code: Hamming, RS or BCH, for example, and operating on one dimension of the block.

FIG. 4a illustrates a turbodecoder of the serial type for information coded by the PCCC turbocoder of FIG. 1.

The decoder comprises a set of elementary decoders concatenated in series, each elementary decoder ($41_i$) corresponding to the elementary coder ($11i$) of the turbocoder.

In the example depicted, the elementary decoders use the LogAPP algorithm and have soft inputs and outputs in the form of log likelihood ratios (also denoted LLRs).

For reasons of clarity the interleavers and deinterleavers have not been shown. It goes without saying, however, that the input data of an elementary decoder must be presented in the same order as for the corresponding coder.

The decoding operation comprises a sequence of iterations 1 to k, each iteration consisting of an identical set of elementary decoding operations.

The input (e) of the decoder receives from the demodulator information in the form of weighted values which are a function of the respective probabilities of the symbols received.

The information received contains a part (X) corresponding to the systematic information and redundant parts ($Y_i$) corresponding respectively to the information output from the elementary coders. A demultiplexer (40) provides the demultiplexing of the different parts of the information received. In addition to the information ($Y_i$), each elementary decoder $D_i$ ($41_i$) naturally receives the systematic information (X) suitably interleaved (input not shown for reasons of clarity) and extrinsic information $e_{i-1}$ supplied by the previous decoder. At the first iteration, the extrinsic information from the first elementary decoder D1 is initialised to 0 and the a priori systematic information at the input of D1 is the received systematic part (X). D1 uses the first redundant information (Y1) to produce a new estimation of the systematic part, also referred to as a posteriori information. The difference between the a posteriori information and the a priori information is the extrinsic information generated by the decoder. This extrinsic information (suitably interleaved) is added to the systematic information (also suitably interleaved) in order to constitute the a priori systematic information of the following decoder. The process continues from decoder to decoder as far as Dn. The extrinsic information produced by the end elementary decoder Dn is transmitted (in fact retropropagated if a single set of elementary decoders is used) to D1 and a new complete decoding cycle is iterated. From iteration to iteration, the estimation of the systematic part gains in reliability and at the end of a number k of iterations the weighted values representing the systematic part (s) are subjected to a hard decision by means of the thresholding device (44). In the case where, for example, the weighted values are weighted bits, information represented by a sequence of bits is obtained at the output (S).

It goes without saying that other types of elementary decoder can be used. In particular, if an algorithm of the non-logarithmic type is used, the addition and subtraction operations are to be replaced by multiplication and division operations. The initial values of the extrinsic information must also be modified accordingly (1 for an APP algorithm, 0.5 for an algorithm evaluating the probabilities).

FIG. 4b illustrates a turbodecoder of the parallel type for information coded by the PCCC turbocoder of FIG. 1.

The decoder comprises a set of elementary decoders concatenated in parallel, each elementary decoder ($41_i$) corresponding to the elementary coder ($11_i$) of the turbocoder.

In the example depicted, the elementary decoders use the LogAPP algorithm and have weighted inputs and output in the form of log likelihood ratios. Here too, although the interleavers and deinterleavers have not been shown, the input data for the elementary decoder must be presented in the same order as for the corresponding coder.

The decoding operation comprises a sequence of iterations 1 to k, each iteration consisting of an identical set of elementary decoding operations.

The principle of the decoding is similar to that described for serial concatenation, the exchanges of extrinsic information taking place here in parallel between two successive iterations. Each elementary decoder Di ($41_i$) also receives the redundant part (Yi), a suitably interleaved version of the systematic part and the extrinsic information from all the other decoders of the previous iteration. Each decoder in one and the same iteration works in parallel, produces a posteriori systematic information and deduces therefrom extrinsic information by difference between the a posteriori systematic information and the a priori systematic information. At the input of an elementary decoder $D_i$ the different items of extrinsic information $e_i$ with i≠j (suitably interleaved) are added to a suitably interleaved version of the systematic information X. The decoder uses the redundant information Yi to supply a new estimation of the systematic part or a posteriori systematic information.

The elementary decoders of the first iteration receive extrinsic information initialised to 0 (where the LogAPP algorithm is used).

The decoders of the last iteration each supply an estimation of the systematic information ($s_i$). The weighted values representing these estimations are, for example, added one by one (43) before a hard decision (44).

It will be understood that a serial-parallel hybrid decoding can be envisaged with different extrinsic information propagation modes. The decoded information output (S) results in all cases from a hard decision from estimations of the systematic parts supplied by the end elementary decoders of the last iteration.

FIG. 5 illustrates a turbodecoder corresponding to the SCCC turbocoder of FIG. 2.

The structure of this decoder was described in an article by S. Benedetto, G. Montorsi, D. Divsalar and F. Pollara entitled "Serial concatenation of interleaved codes: Performance analysis, design and iterative decoding", published in JPL TDA Progr. Rep., vol. 42–126, August 1996.

The decoder comprises a set of elementary decoders concatenated in series, each elementary decoder Di ($51_i$) corresponding to the elementary coder Ci ($21_i$) of the turbocoder.

The decoding operation comprises a sequence of iterations 1 to k, each iteration consisting of an identical set of elementary decoding operations.

For reasons of clarity the interleavers and deinterleavers have not been shown. It goes without saying, however, that the input data of an elementary decoder must be presented in the same order as for the corresponding coder. In particular, two elementary decoders Di and Di+1 in one and the same iteration are separated by a deinterleaver corresponding to the interleaver ($20_i$) separating the coders Ci and Ci+1. Likewise the output (Oc) of an elementary decoder Di+1 is interleaved by an interleaver identical to ($20i$) before being supplied to the decoder Di of the following iteration.

Each elementary decoder has two inputs Ic and Iu and two outputs Oc and Ou. The input Ic receives a priori information relating to data output from the coder Ci whilst the input Iu receives a priori information relating to data input to the said coder. Likewise, the output Oc supplies a posteriori information relating to data output from the coder Ci and the output Ou supplies a posteriori information relating to data input to the said coder. The a posteriori information supplied at Oc by an elementary decoder Di+1 is used as a priori information by the decoder D1 of the following iteration, enabling it to effect a more reliable estimation of the information input to and output from the corresponding coder Ci.

The elementary decoders of the first iteration and the end elementary decoder D1 of the last iteration receive a zero value at their input Iu, given that no a posteriori information from a previous iteration is available.

The output Ou of the end elementary decoder D1 of the last iteration supplies, in the form of weighted values, an estimation of the input information of the coder C1, that is to say of the useful information (X). These values are subjected to a hard decision by thresholding (54) in order to supply the decoded information (S).

FIG. 6 illustrates a turbodecoder corresponding to the BTC turbocoder of FIG. 3.

The decoder comprises a set of elementary decoders concatenated in series, each elementary decoder Di ($61_i$) corresponding to the elementary coder Ci ($31_i$) of the turbocoder.

The decoding operation comprises a sequence of iterations 1 to k, each iteration consisting of an identical set of elementary decoding operations.

The information to be decoded is presented as an n-dimensional block of weighted values supplied, for example, by the input demodulator. The order of the elementary decoders is of little importance, each working here on one orthogonal dimension of the block. The elementary decoders use, for example, the Chase algorithm mentioned above. Each elementary decoder receives the input block in its entirety and carries out an estimation of all the weighted values of the said block according to the coding dimension of the corresponding coder. This a posteriori information is deduced by difference (in the case of a decoder using a logarithmic algorithm) with the a priori information, an item of extrinsic information being presented in the form of a block of weighted values with the same size as the coded block. This extrinsic information is added to the input information in order to serve as a priori information for another decoder. Thus, by successive passes from one dimension to another and from one iteration to the following one, the estimation of the systematic part gains reliability. The weighted parts representing this estimation are then subjected to a hard decision by thresholding (64) in order to supply the decoded systematic information S.

Although the turbocodes produce performances close to the theoretical Shannon limit for large blocks of data, these performances deteriorate in certain configurations: small blocks of data, turbocodes with a high number of dimensions, or block turbocode used on non-Gaussian channels. The turbodecoding does not converge or converges towards a sub-optimal solution leading to erroneous decoded information.

SUMMARY OF THE INVENTION

The problem at the basis of the invention is to remedy these problems of convergence of the turbodecoding and to supply non-erroneous decoded information.

In general terms the decoding method according to the invention effects an error detection on the information decoded by the turbodecoding and in the event of error subtracts, from the weighted values representing the input information, a fraction of the erroneous information translated in the form of weighted values. The sequence of iterations of the turbodecoding is then repeated on the resulting input weighted values. If the information decoded is once again erroneous the previous feedback is once again applied and the sequence of iterations of the turbodecoding once again repeated. The process continues thus until the decoded information is error-free or a given number of iterations is reached. The underlying principle is that, the contribution due to the erroneous information being partially removed from the input information, the turbodecoding now converges towards a non-erroneous solution. Where the presence of residual errors in the decoded information is due to the non-optimality of the turbodecoder, modifying the input information increases the probability that the turbodecoding will leave a local optimum and converge towards the information having the maximum likelihood.

More precisely, the decoding method according to the invention is defined by claim 1. Advantageous embodiments are claimed in the dependent claims.

BRIEF DESCRIPTION OF THE DRAWINGS

A more complete appreciation of the present invention and many of the attendant advantages thereof will be readily obtained as the same becomes better understood by reference to the following detailed description when considered in conjunction with the accompanying drawings, wherein:

FIG. 2 depicts schematically the structure of a turbocoder of the SCCC type;

FIG. 3 depicts schematically the structure of a block turbocoder;

DETAILED DESCRIPTION OF THE PREFERRED EMBODIMENTS

Figure 1:
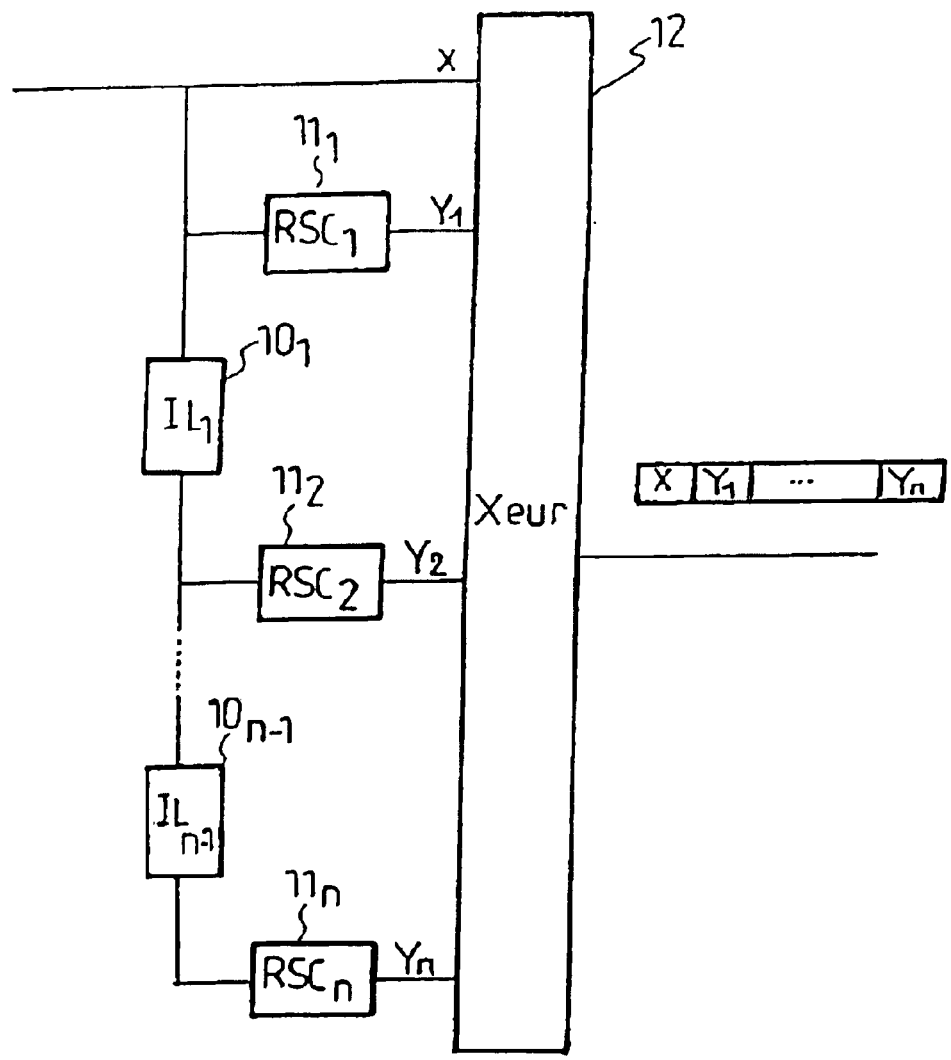
FIG. 1 depicts schematically the structure of a turbocoder of the PCCC type.

Referring now to the drawings, wherein like reference numerals designate identical or corresponding parts throughout the several views, preferred embodiments of the present invention are described.

Figure 6:
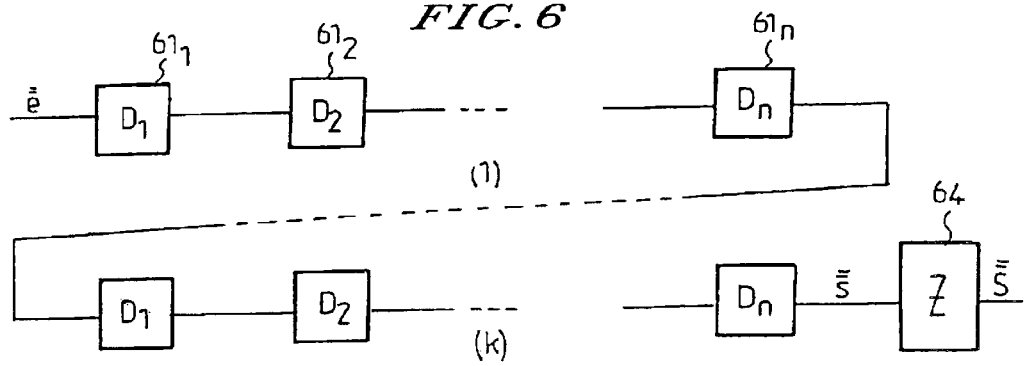
FIG. 6 depicts schematically the structure of a turbodecoder corresponding to the turbocoder of FIG. 3.
Figure 7:
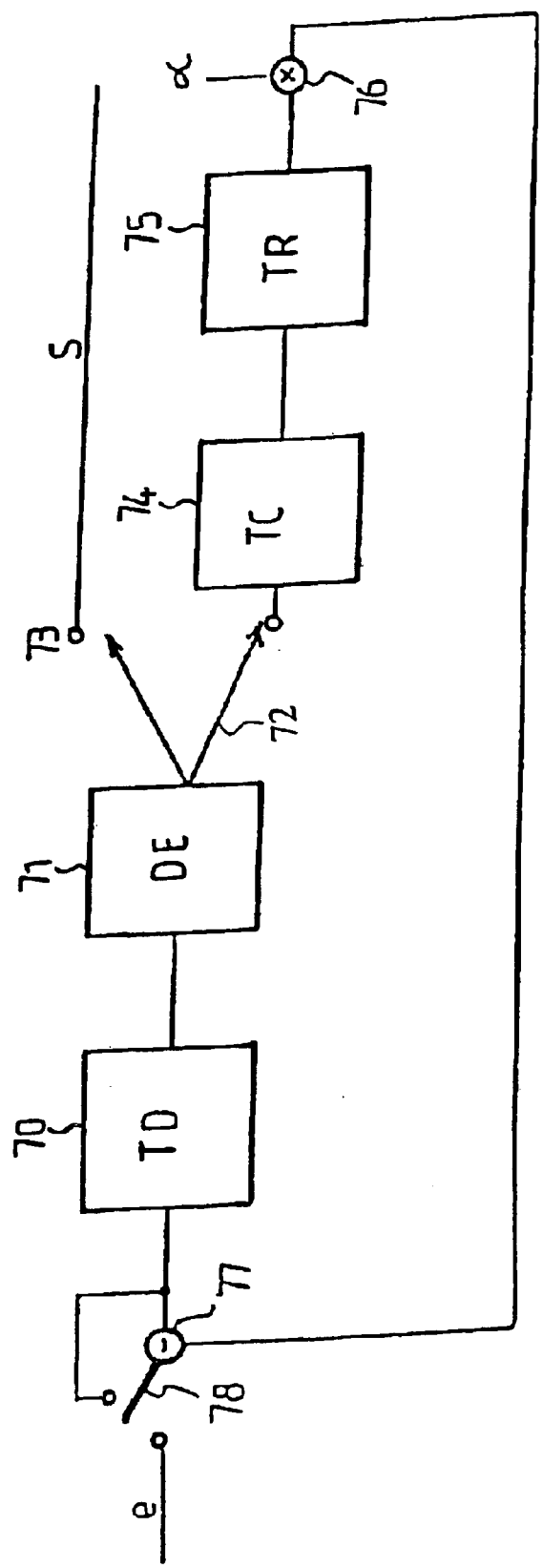
FIG. 7 depicts schematically a turbocoder according to a first embodiment of the invention.

A first embodiment of the invention is illustrated in FIG. 7. The turbodecoding device depicted comprises a conventional turbodecoder (70) which can, for example, be any one of the turbodecoders illustrated in FIGS. 4a, 4b, 5 or 6. It is assumed, in order to simplify the disclosure, that the elementary decoders used are of the LogAPP type, although any other type of elementary decoder can be used.

The switch (78) is first of all switched to the input and the device receives from the demodulator input information to be decoded represented by a set of initial weighted values. The input information is supplied to the turbodecoder (70). The turbodecoded information is transmitted to an error detector (71) controlling a second switch (72). The latter orients the decoded information to the output (73) if the turbodecoded information is error-free and to a turbocoder (74) corresponding to the turbodecoder (70) in the contrary case. The erroneous information is then re-encoded by the turbocoder and then converted, as will be seen later, into weighted values by the operator (75). These weighted values are then multiplied (76) by an attenuation coefficient $\alpha$ before being subtracted from the initial weighted values, which is represented symbolically by the switch (78) in the high position. The input information thus modified is once again turbodecoded and a new error detection takes place. The decoding method continues thus until the turbodecoded information is error free or the number of turbodecoding cycles (each cycle consisting of a sequence of iterations) reaches a given value, a function for example of the quality of service.

The operator (75) expresses the turbodecoded information resulting from a hard decision in terms of weighted values as presented at the output of the demodulator. Thus, in the conventional case of a binary modulation of the BPSK type, where the output of the demodulator can be written $(2x_k-1)+n_k$ where $x_k$ is the value of a transmitted bit and $n_k$ is the noise received, turbodecoded information expressed as a sequence of bits would be transformed into a sequence of +1 values (if the corresponding bit is equal to 1) and −1 values (if the corresponding bit is zero).

The error detection can take place either directly by incorporating in the code an error detecting code (CRC for example) or, as in the case of a block turbodecoder, by using a syndrome calculation if the turbocode includes an elementary block code.

The error detection can also be effected indirectly using a criterion of convergence of the weighted values produced by successive iterations of the turbodecoding. The convergence can be measured by an entropic difference between the distributions of probabilities corresponding to these weighted values, as described for example in the article by M. Moher, entitled "Decoding via cross-entropy minimization" published in Proceedings of Globecom 1993, IEEE Global Telecommunications Conference, vol. 2, pages 809–813.

The convergence can also be assessed from an average of the absolute value of the extrinsic information supplied by the different elementary decoders, as described in the patent application FR0001984 filed on Feb 14, 2000 by the applicant.

According to a variant, not shown, of the first embodiment, the error detection and the turbocoding are applied not only to the output of the turbodecoder, that is to say to the output information from the last iteration of the turbodecoding, but to the output information from the last iterations. Each item of output information is then once again turbocoded before being converted into a set of weighted values. These values are then multiplied by an attenuation coefficient $\alpha_j$ which can be peculiar to the iteration from which they came or common to these iterations. After multiplication, the weighted values resulting from each of the last iterations are subtracted from the input weighted values. In this way, several contributions of erroneous solutions can simultaneously be subtracted from the input information. This variant embodiment is advantageous in the case where the turbocoding method does not converge but oscillates between several erroneous solutions.

The choice of the coefficient $\alpha$ or, where applicable, of the coefficients $\alpha_i$ must be guided by several requirements. It or they must be both sufficiently high to eliminate the contribution of the erroneous solution or solutions and sufficiently low in order not to interfere excessively with the input information to be decoded.

It has been found that a value of $\alpha$ of around 0.001 seems to be relatively well suited to turbocodes functioning on blocks of around 100 bits, on a Gaussian channel with a high signal to noise ratio. However, in the general case, the fine adjustment of this value depends on many parameters: the type of turbocode, the type of channel, the signal to noise ratio, the maximum number of iterations tolerated before processing the following sequence, etc.

The choice of the coefficient or coefficients can be made once and for all during the design of the system or be dynamic as a function of the changes in the transmission conditions, the quality of service etc. In the latter case, the adaptive coefficient or coefficients are obtained by reading from a predetermined table or by a calculation algorithm.

Figure 4A:
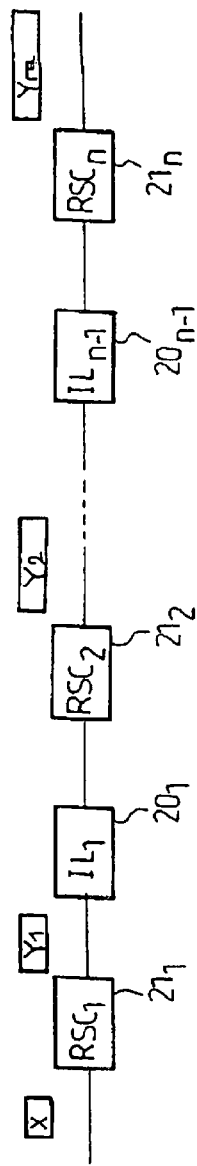
FIG. 4a depicts schematically the structure of a turbodecoder with a serial structure corresponding to the turbocoder of FIG. 1.
Figure 8A:
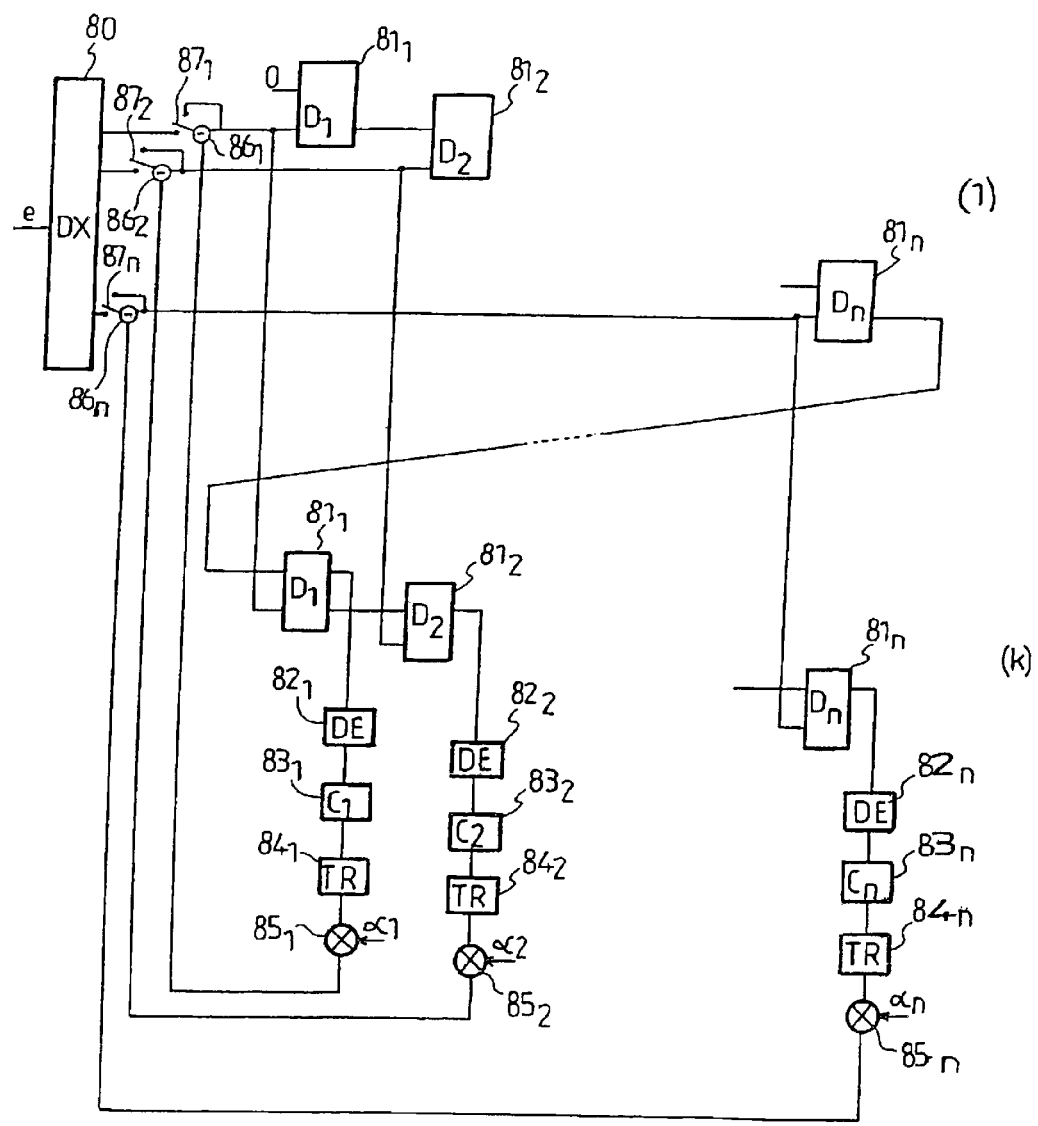
FIG. 8a depicts schematically a turbodecoder of the type depicted in FIG. 4a, according to a second embodiment of the invention.

FIG. 8a illustrates a turbodecoder of the type depicted in FIG. 4a and transformed according to a second embodiment of the invention. This turbodecoder, with a serial structure, is capable of decoding data coded by a turbocoder of the PCCC type like the one in FIG. 1.

The decoder comprises a set of elementary decoders concatenated in series, each elementary decoder ($81_i$) corresponding to the elementary coder ($11_i$) of the turbocoder. The elementary decoders used are here of the LogAPP type, although any other type of elementary decoder can be used.

For reasons of clarity the interleavers and deinterleavers have not been shown.

The decoding operation comprises a sequence of iterations 1 to k, each iteration consisting of an identical set of elementary decoding operations.

The input (e) of the turbodecoder receives from the demodulator information in the form of weighted values as a function of the respective probabilities of the symbols received.

The information received contains a part (X) corresponding to the systematic information and redundant parts ($Y_i$) corresponding respectively to the information output from the elementary coders. A demultiplexer (80) provides the demultiplexing of the different parts of the information received. Initially the switches ($87_i$) are switched onto the outputs of the demultiplexer. The decoding process is then identical to that described for FIG. 4a. It includes a number k of iterations, each representing a complete decoding cycle.

At the end of these k iterations, the output information from each elementary decoder ($81_i$) is subjected to an error detection ($82_i$). The error detection can be direct or indirect, according to one of the methods seen above. Where it is direct, the decoders operate on the values after thresholding. If the detector ($82_n$), at the output of the end elementary decoder ($81_n$), does not detect any error, or in other words if the turbodecoded information does not have any error, the latter is oriented towards the output (not shown). On the other hand, if this turbodecoded information is erroneous, any erroneous elementary decoded information issuing from a decoder ($82_i$), depicted in the form of thresholded values, is re-encoded by the corresponding elementary coder ($83_i$) before being converted into weighted values by the operator ($84_i$). These weighted values are then multiplied by an attenuation coefficient $\alpha_j$, i=1 . . . n, before being subtracted from the input weighted values of the corresponding elementary decoder ($81_i$), which is represented symbolically by the switches ($87_i$) in the high position. The input information thus modified is then subjected to a new turbodecoding cycle. The process continues in this way until the turbodecoded information has no error or the number of turbodecoding cycles (each cycle consisting of a sequence of iterations) reaches a given value, a function for example of the quality of service. The coefficients $\alpha_j$ can be chosen so as to be distinct or identical, fixed or adaptive.

According to a variant (not shown) of the second embodiment, the error detection and the feedback of the erroneous solutions can be effected using the last iterations rather than only the last iteration. This variant therefore uses a plurality of sets of attenuation coefficients. These coefficients, denoted $\alpha_{ij}$, where i is the index of the elementary decoder and j the index of the iteration, can, there too, be chosen so as to be distinct or identical, fixed or adaptive. As seen above, this variant embodiment is advantageous in cases where the turbocoding method does not converge but oscillates between several erroneous solutions.

Figure 8B:
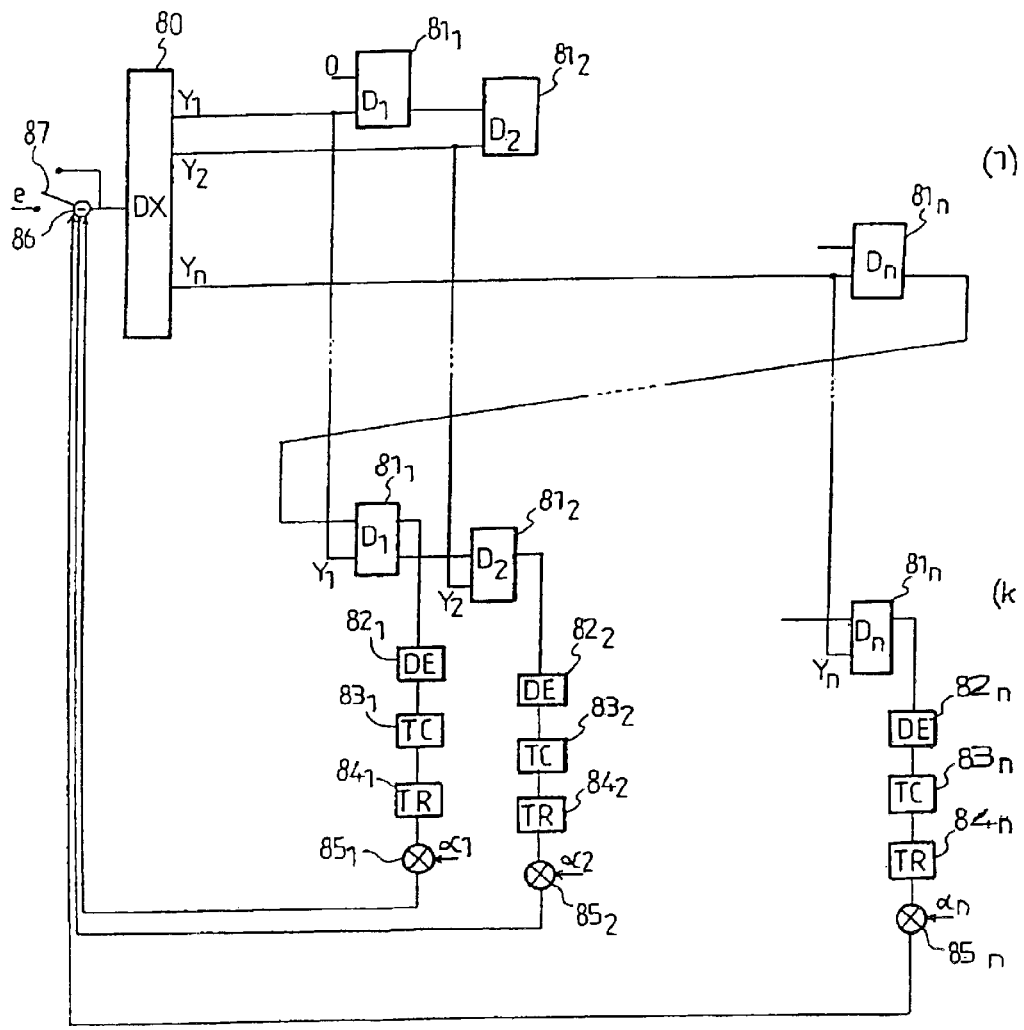
FIG. 8b depicts schematically a turbodecoder of the type depicted in FIG. 4a according to a third embodiment of the invention.

FIG. 8b illustrates a turbodecoder of the type depicted in FIG. 4a and transformed according to a third embodiment of the invention. This turbodecoder, also with a serial structure, is capable of decoding the data coded by a turbocoder of the PCCC type like the one in FIG. 1. The functioning of this turbodecoder is similar to that of FIG. 8a and will therefore not be repeated. It nevertheless differs in that the erroneous elementary information is not re-encoded by the corresponding elementary coder but turbocoded, the feedback no longer taking place elementary decoder by elementary decoder but overall at the input (e) of the turbodecoder.

According to a variant (not shown) of the third embodiment, the error detection and feedback of the erroneous solutions can be effected from the last iterations rather than only from the last iteration. The contributions of the erroneous solutions are all subtracted at the input of the turbodecoder.

Figure 4B:
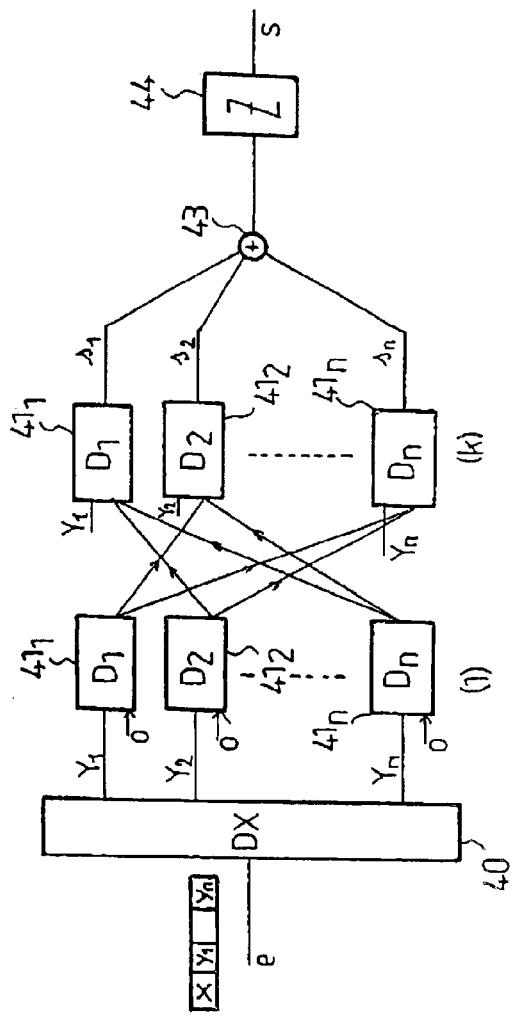
FIG. 4b depicts schematically the structure of a turbodecoder with a parallel structure corresponding to the turbocoder of FIG. 1.
Figure 9A:
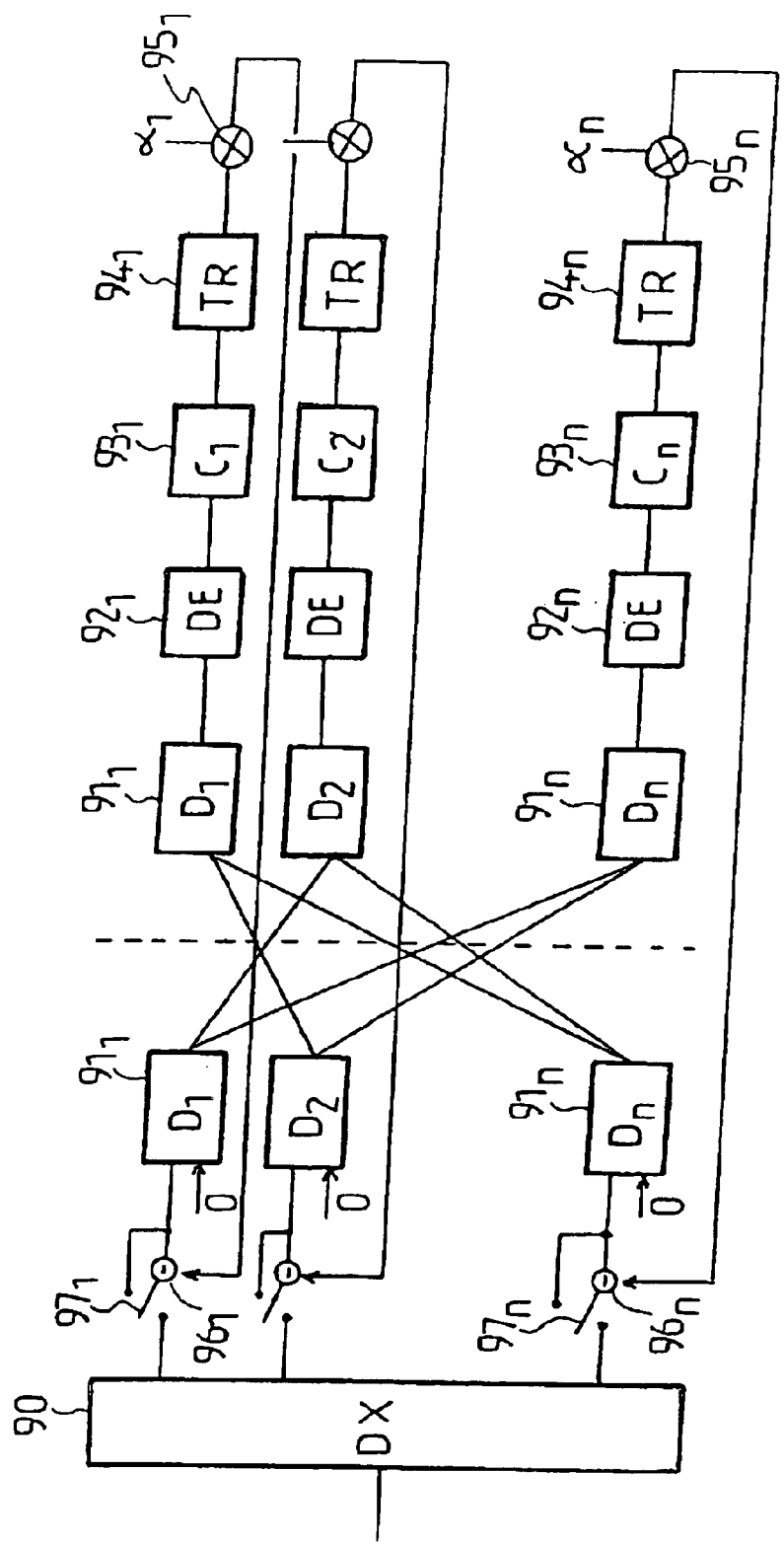
FIG. 9a depicts schematically a turbodecoder of the type depicted in FIG. 4b according to a second embodiment of the invention.

FIG. 9a illustrates a turbodecoder of the type depicted in FIG. 4b and transformed according to a second embodiment of the invention. This turbodecoder, with a parallel structure, is capable of decoding the data coded by a turbocoder of the PCCC type like the one in FIG. 1.

The decoder comprises a set of elementary decoders concatenated in parallel, each elementary decoder ($91_i$) corresponding to the elementary coder ($11_i$) of the turbocoder. The elementary decoders used are here of the LogAPP type although any other type of elementary decoder can be used.

For reasons of clarity the interleavers and deinterleavers have not been shown.

The decoding operation comprises a sequence of iterations 1 to k, each iteration consisting of an identical set of elementary decoding operations.

The input (e) of the turbodecoder receives from the demodulator information in the form of weighted values as a function of the respective probabilities of the symbols received.

The information received contains a part (X) corresponding to the systematic information and redundant parts ($Y_i$) corresponding respectively to the information output from the elementary coders. A demultiplexer (90) provides the demultiplexing of the different parts of the information received. Initially the switches ($97_i$) are switched onto the outputs of the demultiplexer. The decoding process is then identical to that of FIG. 4b. It includes a number k of iterations, each representing a complete decoding cycle.

At the end of these k iterations, the output information from each elementary decoder ($91_i$) is subjected to an error detection ($92_i$). The error detection can be direct or indirect, according to one of the methods seen above. Where it is direct, the decoders operate on the values after thresholding. If none of the detectors ($92_i$) detects any error, the weighted values issuing from each decoder are added and the sum thresholded as in FIG. 4b. On the other hand, if one of the detectors detects an error, the elementary decoded information issuing from the decoder ($92_i$), represented in the form of thresholded values, is re-encoded by the corresponding elementary coder ($93_i$) before being converted into weighted values by the operator ($94_i$). These weighted values are then multiplied by an attenuation coefficient $\alpha_i$, i=1 . . . n, before being deducted ($96_i$) from the input weighted values of the corresponding elementary decoder ($91_i$), which is represented symbolically by the switches ($97_i$) in the high position. The input information thus modified is then subjected to a new turbodecoding cycle. The process continues in this way until none of the detectors ($92_i$) detects any further error or the number of turbodecoding cycles (each cycle consisting of a sequence of iterations) reaches a given value, as a function for example of the quality of service. The coefficients $\alpha_i$ can be chosen so as to be distinct or identical, fixed or adaptive.

According to an alternative version (not shown) of this second embodiment, the error detection is carried out not dimension by dimension at the output of the elementary decoders but directly on the turbodecoded output. The detectors ($92_i$) are omitted and a single error detector at the output of the turbodecoder controls the re-encoding ($93_i$) of the elementary decoded information, its conversion into weighted values ($94_i$), the attenuation ($95_i$) and the subtraction ($96_i$) from the elementary input information.

According to a variant (not shown) of the second embodiment, the error detection and the feedback of the erroneous solutions is effected from the last iterations rather than only from the last iteration. The contributions of the erroneous solutions for the last iterations are all subtracted at the inputs of the elementary decoders and a new turbodecoding cycle is effected. The process continues in this way. This variant therefore uses a plurality of sets of attenuation coefficients. These coefficients, denoted $\alpha_{ij}$, where i is the index of the elementary decoder and j the index of the iteration, can, there too, be chosen so as to be distinct or identical, fixed or adaptive.

Figure 9B:
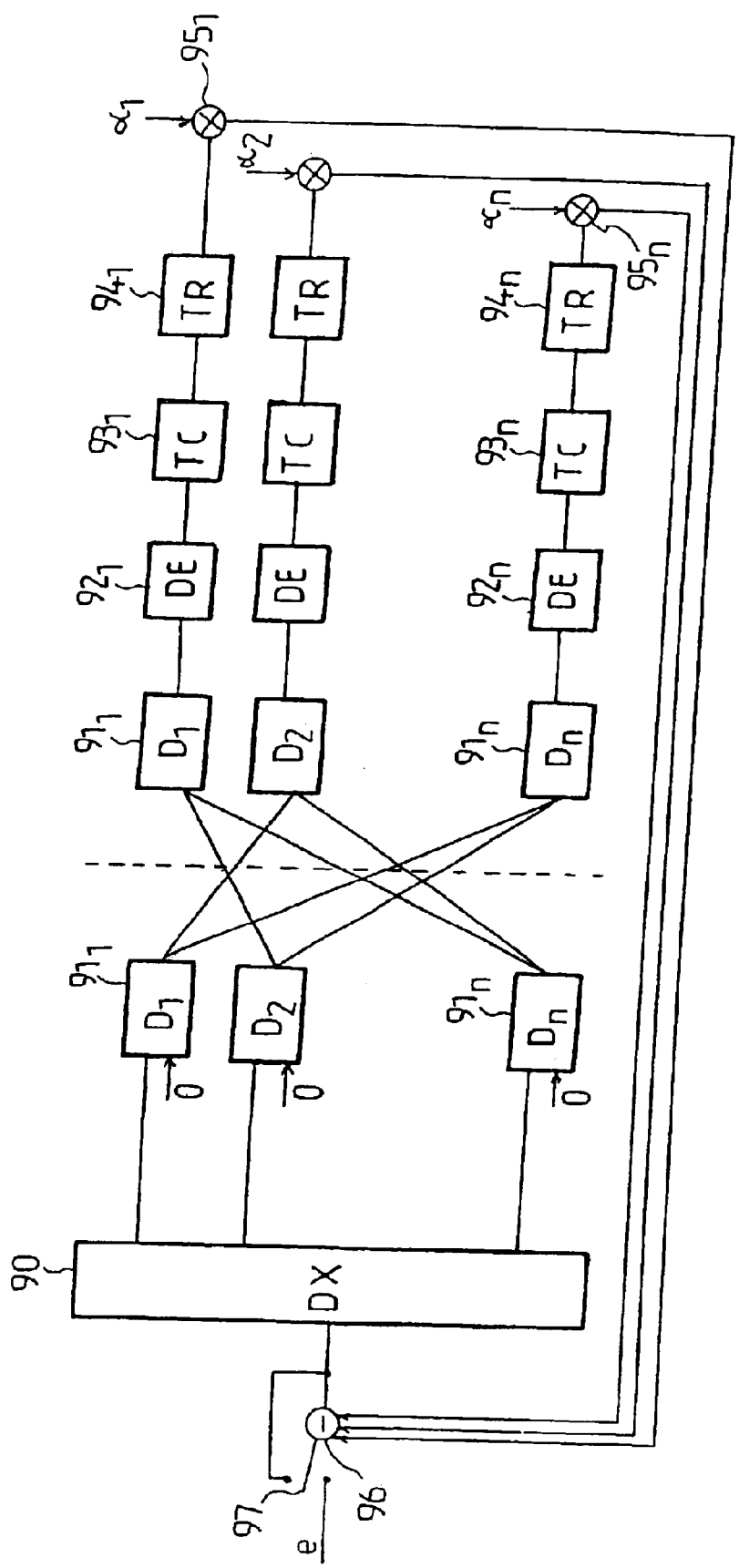
FIG. 9b depicts schematically a turbodecoder of the type depicted in FIG. 4b according to a third embodiment of the invention.

FIG. 9b illustrates a turbodecoder of the type depicted in FIG. 4b and transformed according to a third embodiment of the invention. This turbodecoder, with a parallel structure, is capable of decoding data coded by a turbocoder of the PCCC type like the one in FIG. 1. The functioning of this turbodecoder is similar to that of FIG. 9a and will therefore not be repeated. It nevertheless differs in that the erroneous elementary information is not re-encoded by the corresponding elementary coder but turbocoded, the feedback no longer taking place elementary decoder by elementary decoder but overall at the input (e) of the turbodecoder.

According to an alternative version (not shown) of this third embodiment, the error detection is not carried out dimension by dimension at the output of the elementary decoders but directly on the turbodecoded output. The detectors ($92_i$) are omitted and a single error detector at the output of the turbodecoder controls the re-encoding ($93_i$) of the elementary decoded information, its conversion into weighted values ($94_i$), the attenuation ($95_i$) and the subtraction (96) at the input (e) of the turbodecoder.

According to a variant (not shown) of the third embodiment, the error detection and the feedback of the erroneous solutions can be effected from the last iterations rather than only from the last iteration. The contributions of the erroneous solutions are all subtracted at the input (e) of the turbodecoder.

Figure 5:
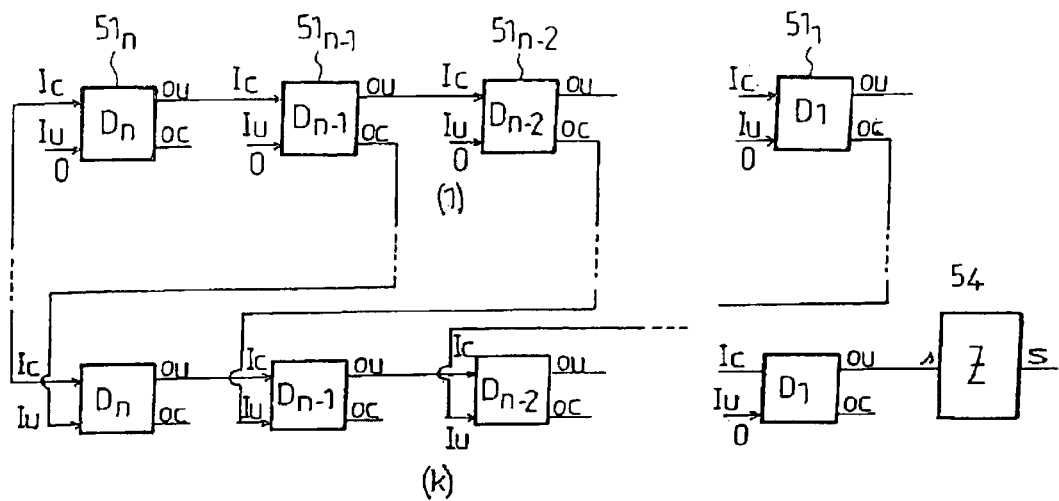
FIG. 5 depicts schematically the structure of a turbodecoder corresponding to the turbocoder of FIG. 2.
Figure 10A:
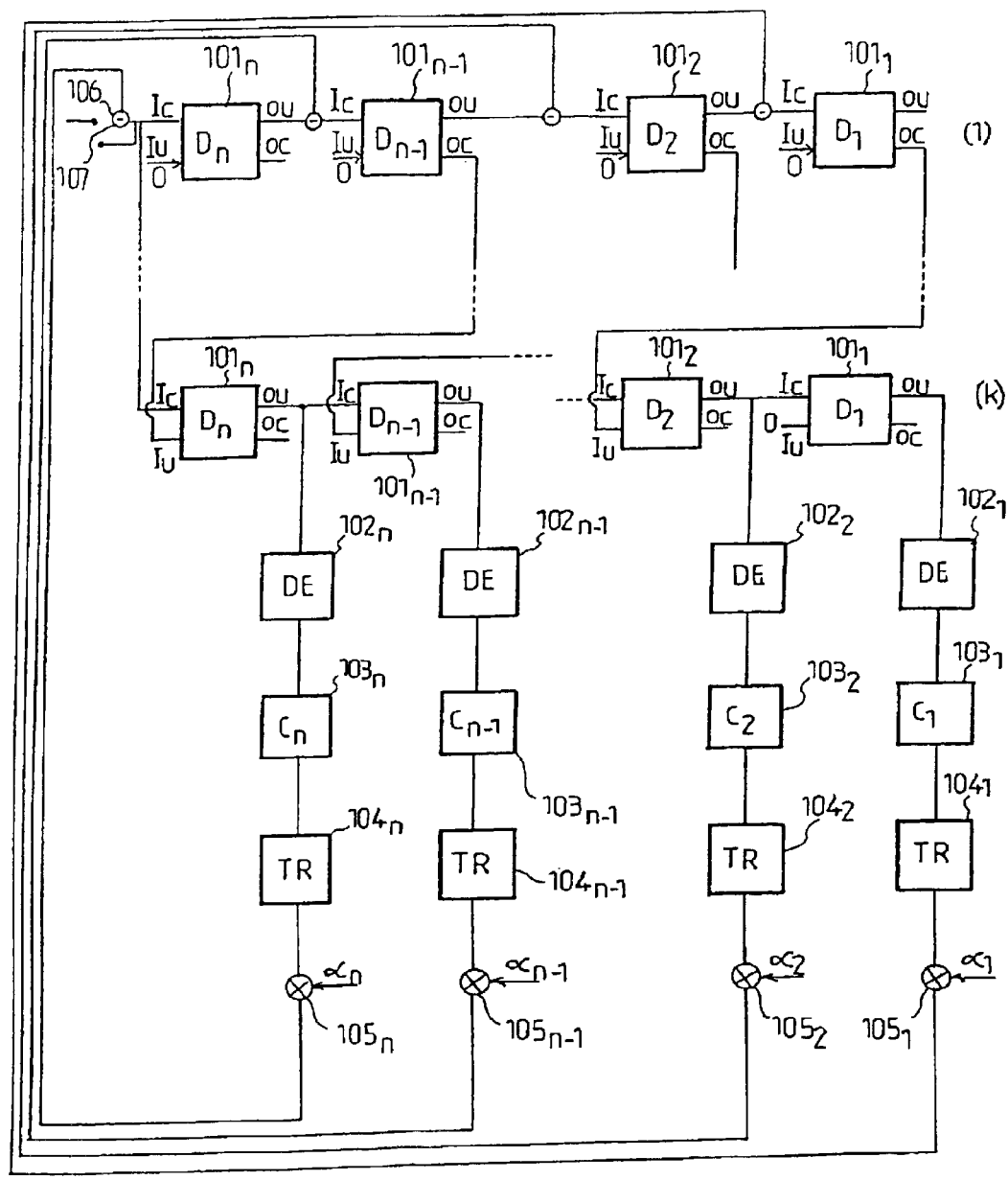
FIG. 10a depicts schematically a turbodecoder of the type depicted in FIG. 5 according to a second embodiment of the invention.

FIG. 10a depicts schematically a turbodecoder of the type depicted in FIG. 5 according to a second embodiment of the invention. This turbodecoder is capable of decoding data coded by a turbocoder of the SCCC type like the one in FIG. 3.

The decoder comprises a set of elementary decoders concatenated in series, each elementary decoder ($101_i$) corresponding to the elementary coder ($21_i$) of the turbocoder. The elementary decoders used are here of the LogAPP type, although other types of elementary decoder can be used.

For reasons of clarity the interleavers and deinterleavers have not been shown. The decoding operation proper is identical to that described in FIG. 5 and will therefore not be repeated here. At the end of the k iterations, the output information from each elementary decoder ($101_i$) is subjected to an error detection ($102_i$). The error detection can be direct or indirect, according to one of the methods seen above. Where it is direct, the decoders operate on the values after thresholding. If the detector ($102_i$), at the output of the end elementary decoder ($101_i$), does not detect any error, or in other words if the turbodecoded information does not exhibit any error, the latter is oriented towards the output (not shown). On the other hand, if this turbodecoded information is erroneous, any erroneous elementary decoded information issuing from a decoder ($101_i$), represented in the form of thresholded values, is re-encoded by the corresponding elementary coder ($103_i$) before being converted into weighted values by the operator ($104_i$). These weighted values are then multiplied by an attenuation coefficient $\alpha_i$, i=1 . . . n, before being subtracted from the input weighted values of the corresponding elementary decoder ($101_i$). The switch (107) is then placed in the low position. The input information of each of the elementary decoders thus having been modified, a new turbodecoding cycle is effected. The process continues in this way until the turbodecoded information has no error or the number of turbodecoding cycles (each cycle consisting of a sequence of iterations) reaches a given value, as a function for example of the quality of service. The coefficients $\alpha_i$ can be chosen so as to be distinct or identical, fixed or adaptive.

According to a variant (not shown) of the second embodiment, the error detection and the feedback of the erroneous solutions can be effected from the last iterations rather than only from the last iteration. This variant therefore uses a plurality of sets of attenuation coefficients. These coefficients, denoted $\alpha_{ij}$, where i is the index of the elementary decoder and j the index of the iteration, can, there too, be chosen so as to be distinct or identical, fixed or adaptive.

Figure 10B:
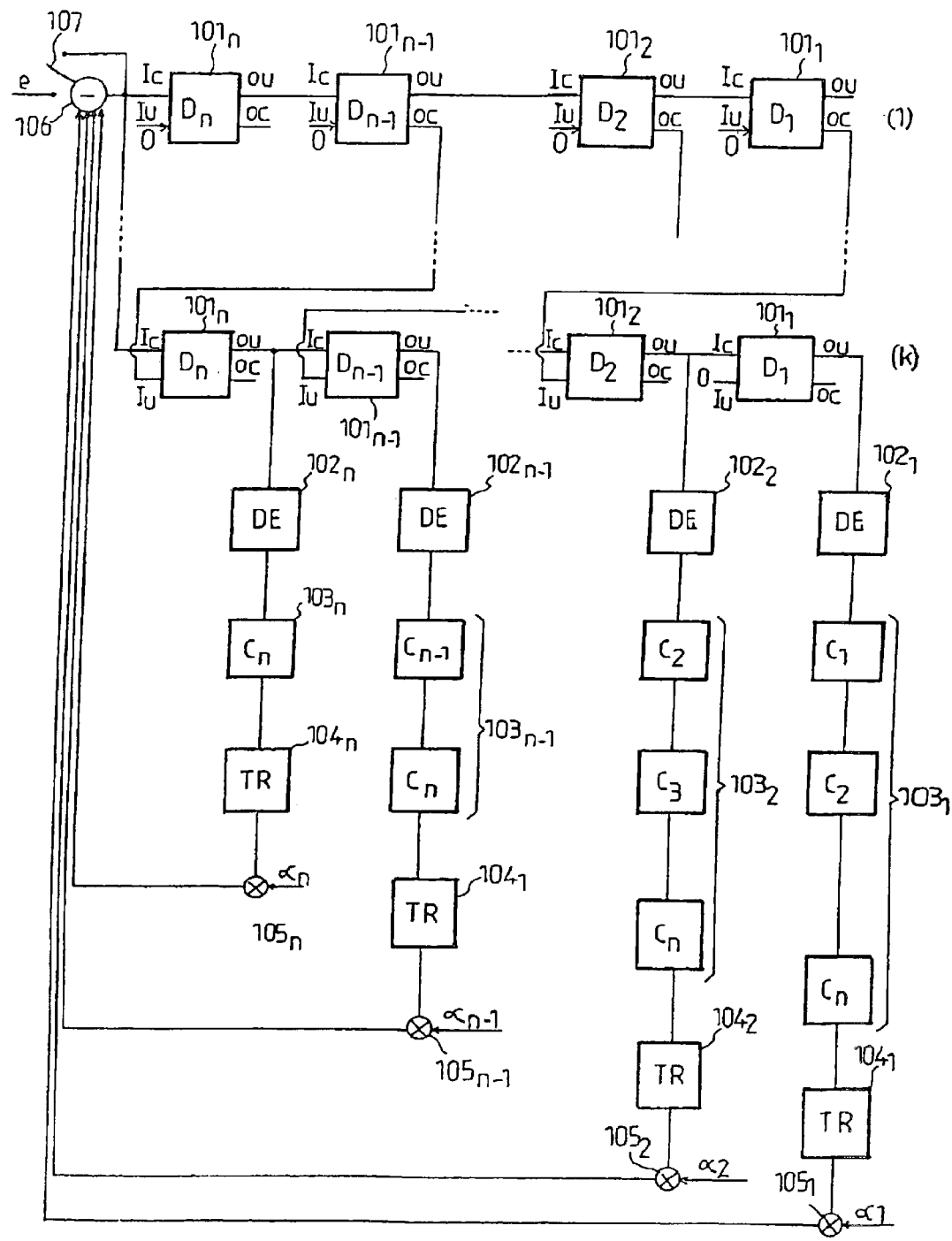
FIG. 10b depicts schematically a turbodecoder of the type depicted in FIG. 5 according to a third embodiment of the invention.

FIG. 10b depicts schematically a turbodecoder of the type depicted in FIG. 5 according to a third embodiment of the invention. The functioning of this turbodecoder is similar to that of FIG. 10a and will therefore not be repeated. It differs nevertheless in that the erroneous elementary information issuing from an elementary decoder ($101_i$) is not re-encoded by the corresponding elementary coder but by the series ($103_i$) of elementary coders $C_i, C_{i+1}, \ldots, C_n$ (and naturally the associated interleavers) passed through at the time of the last iteration. Thus each output of a series ($103_i$) of coders supplies turbocoded information which, after conversion into weighted values and attenuation, can be subtracted at the input (e) of the turbodecoder.

According to a variant (not shown) of the third embodiment, the error detection and the feedback of the erroneous solutions can be effected from the last iterations rather than only from the last iteration. The contributions of the erroneous solutions are then all subtracted at the input (e) of the turbodecoder.

Figure 11:
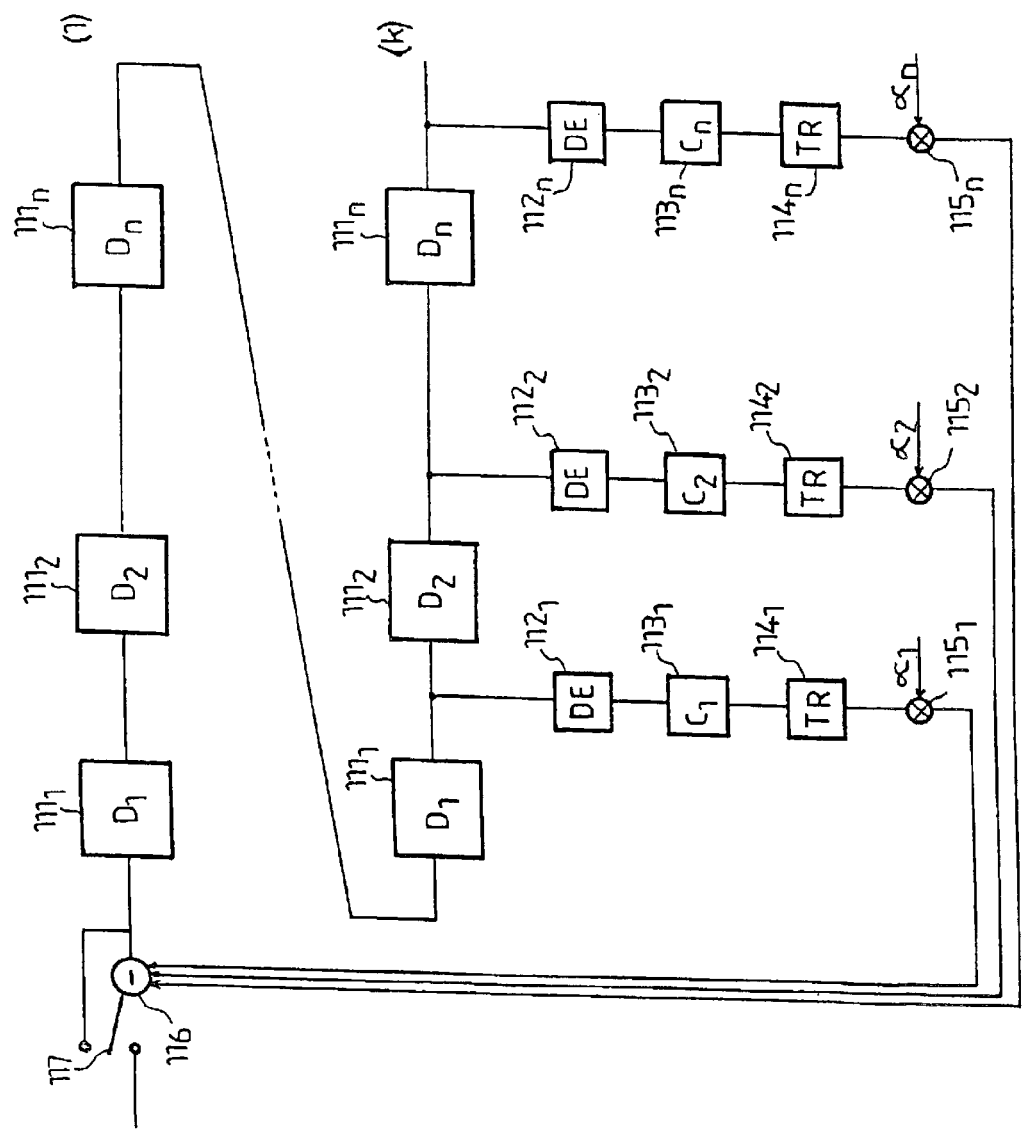
FIG. 11 depicts schematically a turbodecoder of the type depicted in FIG. 6 according to a second embodiment of the invention.

FIG. 11 depicts schematically a turbodecoder of the type depicted in FIG. 6 according to a third embodiment of the invention.

The decoder comprises a set of elementary decoders concatenated in series, each elementary decoder Di ($111_i$) corresponding to the elementary coder Ci ($31_i$) of the turbocoder. The decoders advantageously use the Chase algorithm mentioned above. The order of the decoders is of little importance, each working on an orthogonal direction of the block of input data. The decoder receives from the demodulator a block of weighted values of n dimensions, each dimension corresponding to an elementary code of the n-dimensional code.

The decoding operation is identical to that described in FIG. 6. It comprises a sequence of iterations 1 to k, each iteration consisting of an identical set of elementary decoding operations.

At the end of the k iterations, the output information from each elementary decoder ($111_i$) is subjected to an error detection ($112_i$). The error detection can be effected directly on the thresholded values using a syndrome calculation on each word according to the corresponding dimension i or directly by measurement of convergence, according to one of the methods seen above. These weighted values are then multiplied by an attenuation coefficient $\alpha_i$, i=1 . . . n, before being subtracted (116) dimension by dimension and word by word from the input weighted values. The switch (117) is then placed in the high position. The input information having been thus modified, a new turbodecoding cycle is effected. The process continues in this way until the detectors ($112_i$) no longer detect any error or the number of turbodecoding cycles (each cycle consisting of a sequence of iterations) reaches a given value, as a function for example of the quality of service. The coefficients $\alpha_j$ can be chosen so as to be distinct or identical, fixed or adaptive.

According to a variant (not shown) of the second embodiment, the error detection and the feedback of the erroneous solutions can be effected from the last iterations rather than only from the last iteration. This variant therefore uses a plurality of sets of attenuation coefficients. These coefficients, denoted $\alpha_{ij}$, where i is the index of the elementary decoder and j the index of the iteration, can, there too, be chosen so as to be distinct or identical, fixed or adaptive.

The turbodecoder of the type depicted in FIG. 6 can also be implemented according to a third embodiment of the invention (not shown). In this mode, the coders ($113_i$) of FIG. 11 are no longer the elementary coders $C_i$ but the complete turbocoder. Naturally, the block decoded by the elementary decoder first has all the redundant part removed so that only the systematic sub-block is supplied to the turbocoder. The turbocoded blocks issuing from the different turbocoders are transformed into blocks of weighted values, attenuated and finally all subtracted from the block of input weighted values.

According to a variant (also not shown) of the third embodiment, the error detection and feedback of the erroneous solutions can be effected from the last iterations rather than solely from the last iteration.

Although the present invention has been described in the context of turbodecoding, it also applies, and in more general terms, to turboequalisation, turbodetection, and demodulation of turbo-TCM (Trellis Coded Modulation).

What is claimed is:

1. A method of decoding coded information corresponding to turbo coded source of information, the coded information being represented by a set of initial weighted values, the method comprising:

a finite sequence of iterations;

each of the finite sequence of iterations proceeding with an identical cycle of complete decoding of the coded information by a set of elementary decoding operations concatenated in parallel or in series separated by deinterleaving and/or interleaving steps;

each of the elementary decoding operations receiving an item of input information to be decoded represented by a set of input weighted values and generating an item of elementary decoded information represented by a set of output weighted values;

wherein at least a last iteration of the finite sequence of iterations is followed by at least one hard decision operation supplying an item of output information from the item of elementary decoded information from at least one of the elementary decoding operations of the last iteration; and the method further comprises at least one error detection operation for the item of output information and, in event of error:

the item of output information, obtained by hard decision, is re-encoded and then converted into a set of weighted values;

the weighted values are combined with the initial weighted values or with the input weighted values of an elementary decoding operation of the first iteration to supply modified initial weighted values or modified input weighted values; and the finite sequence of iterations is repeated using the modified values.

2. The decoding method according to claim 1, wherein the error detection is effected by a CRC code.

3. The decoding method according to claim 1, wherein the error detection is effected by measuring the convergence of the output weighted values from at least one elementary decoding operation for a plurality of successive iterations.

4. The decoding method according to claim 3, wherein the measurement of convergence is an entropic difference.

5. The decoding method according to claim 1, wherein the item of input information includes a first item of input information and a second item of input information, the second item of input information serving as an auxiliary item of input information for increasing the reliability of the first item of input information, and wherein the item of output information includes a first item of output information and a second item of output information, the second item of output information serving as an auxiliary item of output information for increasing the reliability of the first item of input information in the following decoding operation.

6. The decoding method according to claim 5, wherein the first item of output information comprises turbodecoded information obtained from at least one end elementary decoding operation of the last iteration.

7. The decoding method according to claim 6, wherein, in an event of error on the turbodecoded information:

the first item of output information is turbocoded according to the turbocoding and then converted into weighted values; and the weighted values are combined with the initial weighted values.

8. The decoding method according to claim 6, wherein the second item of output information is obtained by a plurality of hard decision operations, each of the plurality of hard decision operations operating on the elementary decoded information from an elementary decoding operation of the last iteration and supplying an item of output elementary information;

and, in an event of error on the turbodecoded information:

each item of output elementary information is re-encoded and then converted into a set of weighted values;

the weighted values are combined with the initial weighted values.

9. The decoding method according to claim 8, wherein, the source information is coded by a turbocoding with parallel concatenation of elementary coding operations associated with interleaving steps, each of the finite iterations comprises a set of elementary decoding operations concatenated in series, each of the elementary decoding operations corresponding to an elementary coding operation and being associated with an interleaving or deinterleaving step;

each of the elementary decoding operations of an iteration supplies a reliability auxiliary information item to at least one distinct elementary decoding operation of the following iteration.

10. The decoding method according to claim 9, wherein the re-encoding of the output information comprises the turbocoding.

11. The decoding method according to one of claims 9 to 10, wherein, the source information is coded by a turbocoding with parallel concatenation of elementary coding operations of a recursive systematic type, each of the elementary decoding operations of an iteration supplies an extrinsic information item as reliability auxiliary information, an increase in reliability brought by the elementary operation to the estimation of the systematic information.

12. The decoding method according to claim 11, wherein the error detection is effected using a statistical measurement of the extrinsic information from a plurality of elementary decoding operations.

13. The decoding method according to claim 8, wherein, the source information is coded by a turbocoding with serial concatenation of elementary coding operations separated by interleaving steps, each of the finite iterations comprises a set of elementary decoding operations concatenated in series, each of the elementary decoding operations corresponding to an elementary coding operation;

two elementary decoding operations with consecutive ranks in a same iteration being separated by a deinterleaving step and two elementary decoding operations of consecutive ranks in two consecutive iterations being separated by an interleaving step;

each of the elementary decoding operations of an iteration supplies a reliability auxiliary information item to the decoding operation with a preceding rank in a following iteration.

14. The decoding method according to claim 13, wherein the elementary coding operations are of a recursive systematic type.

15. The decoding method according to claim 8, wherein each of the last iterations of the finite sequence of iterations is followed by the at least one hard decision operation or the plurality of hard decision operations, the at least one error detection operation, and the operation of combination with the initial weighted values or with input weighted values before the finite sequence of iterations is repeated.

16. The decoding method according to claim 15, wherein the finite sequence of iterations is repeated as long as an error is detected.

17. The decoding method according to claim 15, wherein the finite sequence of iterations is repeated until a predetermined number of repetitions is reached.

18. The decoding method according to claim 5, wherein the first item of output information is obtained by a plurality of hard decision operations, each of the plurality of hard decision operations operating on the elementary decoded information from an elementary decoding operation of the last iteration and supplying an output elementary information item;

each output elementary information item is subjected to an error detection operation;

each erroneous output elementary information item is re-encoded and then converted into a set of weighted values;

the weighted values are combined with the initial weighted values.

19. The decoding method according to claim 18, wherein, the source information is coded by a turbocoding produced by a plurality of elementary block coding operations, each of the finite iterations comprises a set of elementary decoding operations concatenated in series, each of the elementary decoding operations of a dimension corresponding to an elementary decoding operation of a same dimension;

each of the elementary decoding operations relating to the dimension supplies a reliability auxiliary information item to the following decoding operation relating to another dimension.

20. The decoding method according to claim 19, wherein the re-encoding of the output elementary information comprises the turbocoding.

21. The decoding method according to claim 19, wherein the re-encoding of an output elementary information item is effected by an elementary coding operation corresponding to an elementary decoding operation from which the output elementary information item came.

22. The decoding method according to claim 19, wherein the error detection is effected by a block code syndrome calculation.

23. The decoding method according to claim 18, wherein, the source information is coded by a turbocoding with parallel concatenation of elementary coding operations associated with interleaving steps, each of the finite iterations comprises a set of elementary decoding operations concatenated in series, each of the elementary decoding operations corresponding to an elementary coding operation and being associated with an interleaving or deinterleaving step;

each of the elementary decoding operations of an iteration supplies a reliability auxiliary information item to at least one distinct elementary decoding operation of the following iteration.

24. The decoding method according to claim 23, wherein the re-encoding of the output information comprises the turbocoding.

25. The decoding method according to claim 5, wherein the weighted values are expressed as log likelihood values and a combination operation comprises subtracting a fraction of the weighted values obtained by converting the first or second output information item to the initial values or to the weighted input values.

26. The decoding method according to claim 25, wherein the fraction of the weighted values is obtained by multiplying them with adaptive coefficients which are a function of a type of turbocode and/or the signal to noise ratio and/or a type of transmission channel.

* * * * *